United States Patent
Gao

(10) Patent No.: US 11,862,490 B2
(45) Date of Patent: Jan. 2, 2024

(54) DIFFUSION FURNACE

(71) Applicant: CHANGXIN MEMORY TECHNOLOGIES, INC., Hefei (CN)

(72) Inventor: Pengfei Gao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 134 days.

(21) Appl. No.: 17/500,754

(22) Filed: Oct. 13, 2021

(65) Prior Publication Data
US 2023/0031706 A1    Feb. 2, 2023

Related U.S. Application Data

(63) Continuation of application No. PCT/CN2021/112482, filed on Aug. 13, 2021.

(30) Foreign Application Priority Data

Jul. 28, 2021    (CN) .......................... 202110858512.1

(51) Int. Cl.
*F27B 17/00*    (2006.01)
*H01L 21/67*    (2006.01)
(Continued)

(52) U.S. Cl.
CPC .... *H01L 21/67109* (2013.01); *F27B 17/0025* (2013.01); *F27B 17/0083* (2013.01);
(Continued)

(58) Field of Classification Search
CPC ......... H01L 21/67109; H01L 21/67303; H01L 21/67098; F27B 17/0025; F27B 17/0033; F27B 17/083; F27D 3/0084; F27D 5/0037
See application file for complete search history.

(56) References Cited

U.S. PATENT DOCUMENTS 5,620,525 A * 4/1997 van de Ven ....... H01L 21/68771
                                                                      118/724
8,835,333 B2 * 9/2014 Ota .................. H01L 21/67109
                                                                      438/57
(Continued)

FOREIGN PATENT DOCUMENTS

CN    102051602 A    5/2011
CN    102437071 A    5/2012
(Continued)

OTHER PUBLICATIONS

OA for counterpart application 202110858512.1 mailed Feb. 23, 2022.
(Continued)

*Primary Examiner* — Gregory A Wilson
(74) *Attorney, Agent, or Firm* — Ladas & Parry LLP

(57) ABSTRACT

The present application discloses a diffusion furnace, including: a furnace tube structure including a furnace tube body and a furnace bottom, a bottom of the furnace tube body being connected to the furnace bottom to form a reaction chamber; and a carrying structure including a pedestal and a plurality of cassettes disposed on the pedestal, the pedestal being disposed on the furnace bottom. By disposing the plurality of the cassettes, a height of the furnace tube body can be decreased and a width of the furnace tube body can be increased, thus enlarging a space of equipment repair and maintenance, which is favorable for the repair and maintenance of the equipment.

15 Claims, 4 Drawing Sheets

(51) Int. Cl.
*H01L 21/673* (2006.01)
*F27D 3/00* (2006.01)
*F27D 5/00* (2006.01)

(52) U.S. Cl.
CPC ......... *F27D 3/0084* (2013.01); *F27D 5/0037* (2013.01); *H01L 21/67303* (2013.01)

(56) References Cited

U.S. PATENT DOCUMENTS

| | | | |
|---|---|---|---|
| 10,229,845 B2* | 3/2019 | Hyon | F27B 3/02 |
| 10,960,435 B2* | 3/2021 | Fujikawa | C23C 16/45591 |
| 11,127,617 B2* | 9/2021 | Garssen | H01L 21/67769 |
| 11,139,191 B2* | 10/2021 | Garssen | H01L 21/67769 |
| 2008/0210168 A1* | 9/2008 | Su | H01L 21/67109 |
| | | | 118/724 |
| 2021/0035841 A1* | 2/2021 | Fluit | H01L 21/67109 |

FOREIGN PATENT DOCUMENTS

| | | | | |
|---|---|---|---|---|
| CN | 108088247 A | | 5/2018 | |
| CN | 208923050 U | | 5/2019 | |
| CN | 108088247 B | * | 8/2019 | ......... F27B 17/0025 |
| CN | 110894598 A | | 3/2020 | |
| JP | 01302815 A | | 12/1989 | |
| JP | 200802814 A | | 2/2008 | |
| JP | 2010177653 A | | 8/2010 | |
| TW | 200512860 A | | 4/2005 | |
| WO | 1997045857 A1 | | 12/1997 | |

OTHER PUBLICATIONS

International Search Report and Written Opinion for application No. PCT/CN2021/112482, dated Apr. 26, 2022, 9 pages.

* cited by examiner

DIFFUSION FURNACE

CROSS-REFERENCE TO RELATED APPLICATIONS

This application is a continuation of International Patent Application No. PCT/CN2021/112482 filed on Aug. 13, 2021, which claims priority to Chinese Patent Application No. 202110858512.1 filed on Jul. 28, 2021. The above-referenced patent applications are incorporated herein by reference in their entirety.

TECHNICAL FIELD

The present application relates to the field of semiconductor manufacturing technologies, and in particular, to a diffusion furnace.

BACKGROUND

A diffusion furnace is a thermal processing unit which is used for performing processes, such as diffusion, oxidization and sintering, on silicon wafers in the process of semiconductor device manufacturing. Main reactors are generally divided into a horizontal type and a vertical type. At present, in the manufacturing of 12-inch wafers, a reaction chamber of a diffusion furnace is generally of a vertical quartz tube structure. The wafers are sequentially arranged in a single row from the top down through a cassette carrying structure, with 100 to 125 wafers processed each time, and in order to save a height space, the wafers are densely arranged. This structure is simple and widely applicable, but has the problem of a great difference in filming quality caused by a great difference between upper and lower reaction conditions as a result of a large height of the reaction chamber. Even though an atomic vapor deposition process with the best filming quality has been employed at present, there still exists a difference between upper and lower reaction conditions, which can hardly be eliminated and will multiply the process time. In addition, a large height and a small width of the vertical furnace tube result in a small space and great difficulty of equipment repair or maintenance and the waste of manpower and time. With an increase in wafer size in semiconductor manufacturing in the future, the furnace tube of the vertical reaction chamber structure will become higher, so the above defects will become more obvious.

SUMMARY

Embodiments of the present application provide a diffusion furnace, including: a furnace tube structure including a furnace tube body and a furnace bottom, a bottom of the furnace tube body being connected to the furnace bottom to form a reaction chamber; and a carrying structure including a pedestal and a plurality of cassettes disposed on the pedestal, the pedestal being disposed on the furnace bottom.

REFERENCE NUMERALS

11—furnace tube body; 12—furnace bottom; 13—pedestal; 14—cassette; 15—first heater; 16—second heater; 17—gas intake tube; 18—exhaust port; 19—vertical tube; 20—reaction chamber; 100—manipulator; 141—supporting post; 142—supporting part; 143—base.

DESCRIPTION OF EMBODIMENTS

In order to make the object, technical solution and advantages of the present application clearer, the embodiments of the present application will be further described in detail below in conjunction with specific embodiments and with reference to the accompanying drawings. It should be understood that these descriptions are merely exemplary rather than intended to limit the scope of the present application. In addition, descriptions of well-known structures and technologies are omitted in the following description in order to avoid the unnecessary confusion of the concept of the present application.

Figure 1:
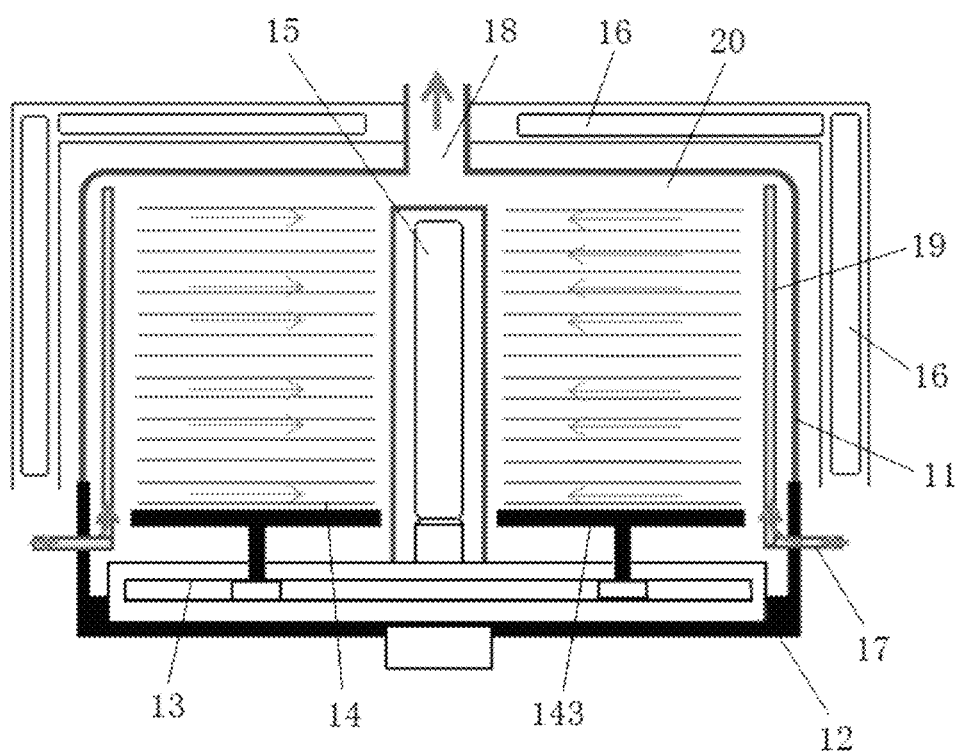
FIG. 1 is a schematic structural diagram of a diffusion furnace according to one embodiment of the present application.
Figure 2:
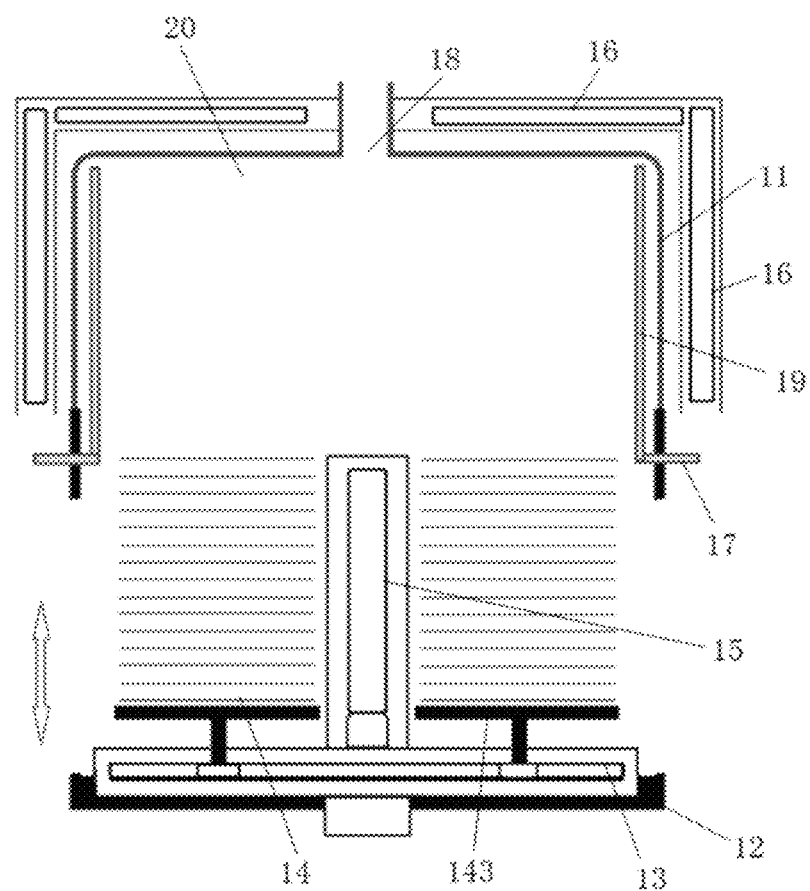
FIG. 2 is a schematic structural diagram of a diffusion furnace according to another embodiment of the present application.
Figure 3:
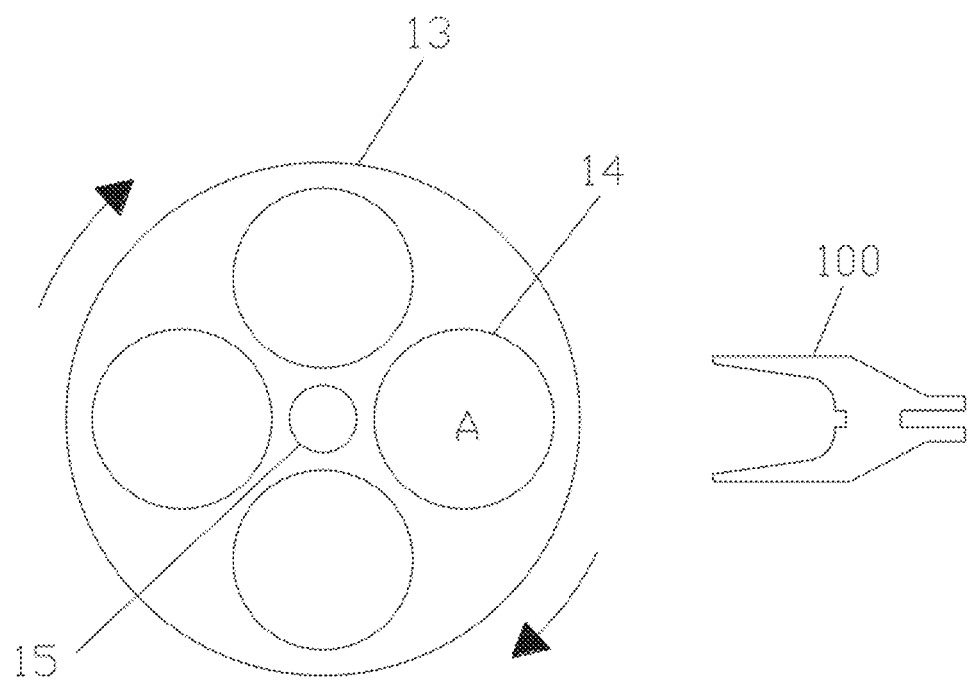
FIG. 3 is a schematic structural diagram of a diffusion furnace according to yet another embodiment of the present application.
Figure 4:
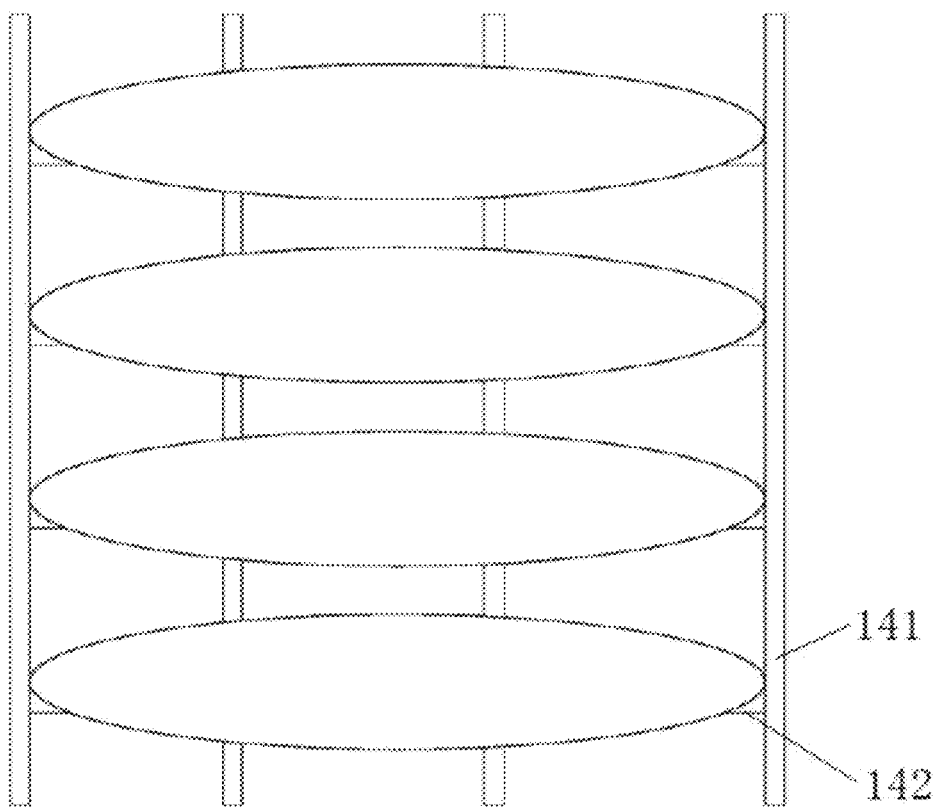
FIG. 4 schematically shows a schematic structural diagram of a cassette.

Referring to FIGS. 1 to 3, the embodiments of the present application provide a diffusion furnace, including: a furnace tube structure including a furnace tube body 11 and a furnace bottom 12, a bottom of the furnace tube body 11 being connected to the furnace bottom 12 to form a reaction chamber 20; and a carrying structure including a pedestal 13 and a plurality of cassettes 14 disposed on the pedestal 13, the pedestal 13 being disposed on the furnace bottom 12. Three, four, five or more cassettes 14 may be disposed. Referring to FIG. 4, a single cassette 14 includes a plurality of supporting posts 141 and a plurality of supporting parts 142, with the plurality of supporting parts 142 evenly distributed at intervals along a vertical direction of the supporting posts 141, and wafers are disposed on the supporting parts 142. The wafers are carried by the cassettes and sequentially arranged in a single row from the top down. A height of a single original cassette structure is normally set as 144 slots, with a wafer being capable of being disposed on each slot. Four cassette structures may be disposed, that is, 50 slots may be designed on each cassette 14, 200 slots in total. Therefore, a height of the furnace tube body 11 can be decreased and a width of the furnace tube body 11 can be increased, thus enlarging a space of equipment repair and maintenance, which is favorable for the repair and maintenance of the equipment. Moreover, a decrease in a height of the reaction chamber 20 reduces a difference between upper and lower reaction conditions, so that a difference in filming quality of the wafers can be reduced, increasing the yield of products. Furthermore, since the difference between the upper and lower reaction conditions is reduced, the process time can be shortened, increasing the efficiency of production.

In some embodiments, the wafers are carried by the cassettes and sequentially arranged in a single row from the top down. The height of a single original cassette structure is normally set as 144 slots, with a wafer being capable of being disposed on each slot. Three cassette structures may be disposed, that is, 60 slots may be designed on each cassette 14, 180 slots in total. Therefore, a height of the furnace tube body 11 can be decreased and a width of the furnace tube body 11 can be increased (i.e., a diameter of the reaction chamber 20 is increased), thus enlarging a space of equipment repair and maintenance, which is favorable for the repair and maintenance of the equipment. Moreover, a decrease in a height of the reaction chamber 20 reduces a difference between upper and lower reaction conditions, so that a difference in filming quality of the wafers can be reduced, increasing the yield of products. Furthermore, since the difference between the upper and lower reaction conditions is reduced, the process time can be shortened, increasing the efficiency of production.

In some embodiments, the wafers are carried by the cassettes and sequentially arranged in a single row from the top down. The height of a single original cassette structure is normally set as 144 slots, with a wafer being capable of being disposed on each slot. Five cassette structures may be disposed, that is, 40 slots may be designed on each cassette 14, 200 slots in total. Therefore, a height of the furnace tube body 11 can be decreased and a width of the furnace tube body 11 can be increased (i.e., a diameter of the reaction chamber 20 is increased), thus enlarging a space of equipment repair and maintenance, which is favorable for the repair and maintenance of the equipment. Moreover, a decrease in a height of the reaction chamber 20 reduces a difference between upper and lower reaction conditions, so that a difference in filming quality of the wafers can be reduced, increasing the yield of products. Furthermore, since the difference between the upper and lower reaction conditions is reduced, the process time can be shortened, increasing the efficiency of production.

In some embodiments, the pedestal 13 is rotatably connected to the furnace bottom 12. A rotary shaft may be disposed at a center of the pedestal 13. The pedestal 13 may be rotated relative to the furnace bottom 12, so that the plurality of cassettes 14 on the pedestal 13 can be synchronously rotated. Thus, a concentration of the reactive gas in the reaction chamber 20 can be more uniform, which contributes to the more uniform formation of a film thickness of the wafers, and consequently, a uniform filming effect and a uniform filming quality are achieved, reducing the difference.

In some embodiments, the cassettes 14 are rotatably connected to the pedestal 13. The cassette 14 may further include a base 143, supporting posts 141 may be fixed on the base 143, and a rotary shaft may be disposed at the bottom of the base 143, so that the cassette 14 can be rotated relative to the pedestal 13. Therefore, each cassette 14 can be separately rotated, further stirring the reactive gas in the reaction chamber 20, so that the concentration of the reactive gas in the reaction chamber 20 can be more uniform and temperature distribution in the reaction chamber 20 can be more uniform to reduce a temperature difference in the reaction chamber 20, achieving the uniform heating of surfaces of the wafers and the uniform contact between the surfaces of the wafers and the reactive gas, which contributes to the more uniform formation of the film thickness of the wafers, and consequently, a uniform filming effect and a uniform filming quality are achieved, reducing the difference.

In one embodiment of the present application, the furnace tube body 11 and the furnace bottom 12 are arranged to move up and down relative to each other. In some embodiments, the furnace tube body 11 may be arranged to move up and down, and second heaters 16 and a gas path system on the furnace tube body 11 may move up and down together, while the furnace bottom 12 may be stationary. In some embodiments, the furnace bottom 12 may be arranged to move up and down, so that the carrying structure on the furnace bottom 12 can move up and down together, while the furnace tube body 11 may be stationary. The direction of an arrow shown in FIG. 2 is a direction along which the furnace tube body 11 or the furnace bottom 12 moves up and down.

In some embodiments, the plurality of the cassettes 14 are distributed in a circumferential array at intervals along a central axis of rotation of the pedestal 13 and the furnace bottom 12. Optionally, a number of the cassettes 14 is set as four. Since the cassettes 14 can be separately rotated and the pedestal 13 can be rotated relative to the furnace bottom 12, the cassettes can be rotated separately or together. The cassettes 14 may be evenly distributed in a circumferential array at intervals on the pedestal 13, and a width direction or diameter of the reaction chamber 20 may be designed to be optimized and minimized. In addition, during taking off and placing wafers, each cassette 14 is required to be rotated to the fixed position A, and the wafers are then handled by a manipulator 100. Thus, the pedestal 13 can be rotated and accurately positioned, so that each cassette 14 can be rotated clockwise and accurately stopped at the fixed position A. Therefore, the wafers on the four cassettes 14 can be transferred, taken off or placed by the same set of manipulator 100 without adding extra transfer cost. The direction of an arrow shown in FIG. 3 is a direction of rotation of the pedestal 13.

In some embodiments, each of the cassettes is arranged to be separately rotated relative to the pedestal; and/or the plurality of cassettes are arranged to be rotated together relative to the furnace bottom through the pedestal.

In some embodiments, a first heater 15 is disposed at a center surrounded by the plurality of cassettes 14, and is connected to the pedestal 13. By adding the first heater 15 at the center surrounded by the four cassettes 14, the problem of nonuniform heating of the wafers caused by the increased diameter of the reaction chamber can be solved.

In some embodiments, the furnace tube structure further includes second heaters 16, which are distributed outside the furnace tube body 11. The second heaters 16 are disposed on an outer sidewall and top of the furnace tube body 11 and combined with the first heater 15 disposed at the center of the reaction chamber 20, so that the problem of low center temperature and top temperature caused by the increased diameter of the reaction chamber can be solved, enabling the wafers to be heated more uniformly.

Under a same temperature, film thicknesses are different due to a concentration problem of the reactive gas, but adjusting the temperature to solve the concentration problem will make film thickness etch rates different. Since the reaction chamber is of a vertical structure, there exists a problem in the entry and discharge of the gas, leading to nonuniform gas concentrations at different heights in the reaction chamber. Aimed at these problems, the applicant of the present application also adopts the following technical solution: the furnace tube structure further includes a gas path system configured to supply the reactive gas to the reaction chamber 20; the gas path system includes a gas intake tube 17, an exhaust port 18 and vertical tubes 19 communicated with the gas intake tube, with the gas intake tube 17 disposed on the furnace tube body 11 and close to the bottom of the furnace tube body 11 and the exhaust port 18 disposed at the top of the furnace tube body 11 and communicated with the reaction chamber 20; and the reactive gas in the vertical tubes 19 is blown to gaps between the wafers spaced in a vertical direction. The vertical tube 19 may be provided with a plurality of blowholes, which are evenly arranged at intervals along a vertical direction of the vertical tube 19, a bottom end of the vertical tube 19 is communicated with the gas intake tube 17, and thus, the reactive gas can sequentially be blown to the gap between each two wafers spaced in the vertical direction from the bottom up, so that the surfaces of the wafers can be in uniform contact with the reactive gas. The exhaust port 18 may be disposed at a central position of the top of the furnace tube body 11. As shown in FIG. 1, the direction of an arrow is a direction along which the reactive gas enters the reaction chamber 20 from the gas intake tube 17 and the gas discharged from the exhaust port 18 flows. Thus, the flow of the reactive gas can circulate from the bottom up in a smoother manner, and consequently, the entry and discharge of the gas better meet the law of gas flow. Moreover, since the cassettes 14 can be rotated together and/or separately, gas concentrations at different heights in the reaction chamber can be more uniformly dispersed, which contributes to the more uniform formation of the film thickness of the wafers, and consequently, a uniform filming effect and filming quality is achieved, reducing the difference, and the process time can be shortened, increasing the efficiency of production.

In some embodiments, the vertical tubes 19 are distributed in a circumferential array at intervals along the central axis of rotation of the pedestal 13 and the furnace bottom 12. The vertical tubes 19 are in one-to-one correspondence with the cassettes 14, which are located between the vertical tubes 19 and the first heater 15. The vertical tubes 19 are disposed outside the cassettes 14, and each vertical tube 19 may be disposed in one-to-one correspondence with each cassette 14. The vertical tubes 19 may be disposed on diameters of two opposite cassettes 14 passing through the center of rotation of the pedestal 13 and the furnace bottom 12. Thus, the reactive gas can sequentially be blown to the gap between each two wafers spaced in the vertical direction from the bottom up, reach the center and then get out from the exhaust port 18, so the flow of the reactive gas can circulate from the bottom up and from the outside to the inside in a smoother manner, enabling the surfaces of the wafers to be in uniform contact with the reactive gas.

In an exemplary embodiment, the gas intake tube includes a main gas inlet and an annular tube communicated with the main gas inlet, with the annular tube circularly disposed along the plurality of cassettes, and the vertical tubes 19 are communicated with the annular tube. The reactive gas can enter the annular tube from the main gas inlet, then respectively enter the vertical tubes 19 and sequentially be blown to the gap between each two wafers spaced in the vertical direction via the blowholes from the bottom up, so that the surfaces of the wafers can be in uniform contact with the reactive gas. Alternatively, a plurality of gas intake tubes 17 are disposed to be in one-to-one correspondence with and communicated with the vertical tubes 19, and thus, the gas intake tubes 17 are distributed at intervals along the furnace tube body 11.

In some embodiments, the furnace tube structure further includes a gas path system configured to supply the reactive gas to the reaction chamber, and the gas path system includes a gas intake structure and an exhaust structure, both of which are disposed on the furnace tube body and communicated with the reaction chamber. The reactive gas enters the reaction chamber 20 via the gas intake structure, is blown to the gaps between the wafers spaced in the vertical direction and carried by the cassettes 14 and then gets out via the exhaust structure. Both the gas intake structure and the exhaust structure may be disposed on the furnace tube body 11, the gas intake structure may be disposed at the bottom of the furnace tube body 11, and the exhaust structure may be disposed at the top of the furnace tube body 11; or the gas intake structure may be disposed close to the bottom of the furnace tube body 11, and the exhaust structure may be disposed on a sidewall of the furnace tube body 11 close to the top; or both the gas intake structure and the exhaust structure may be disposed on the sidewall of the furnace tube body 11, and the exhaust structure may be higher than the gas intake structure. The gas intake structure and the exhaust structure may be arranged in various ways, which are not limited herein.

In some embodiments, the gas intake structure includes a gas intake tube 17, which is disposed close to the bottom of the furnace tube body 11; the gas path system further includes vertical tubes 19 communicated with the gas intake tube, and the vertical tube 19 is provided with a plurality of blowholes distributed at intervals along the vertical direction of the vertical tube 19, so that the reactive gas in the vertical tube 19 can be blown to the gaps between the wafers spaced in the vertical direction; the exhaust structure includes an exhaust passage and an exhaust port, with the exhaust passage arranged vertically, a top end of the exhaust passage communicated with the reaction chamber 20 and a bottom end of the exhaust passage communicated with the exhaust port; the exhaust port is higher than the gas intake tube, and the exhaust passage is higher than the cassettes 14. The vertical tube 19 may be provided with a plurality of blowholes, which are evenly arranged at intervals along the vertical direction of the vertical tube 19, the bottom end of the vertical tube 19 is communicated with the gas intake tube 17, and thus, the reactive gas can sequentially be blown to the gap between each two wafers spaced in the vertical direction from the bottom up, so that the surfaces of the wafers can be in uniform contact with the reactive gas. Since the exhaust passage is higher than the cassettes 14, the reactive gas then enters the exhaust passage from the top end of the exhaust passage and gets out via the exhaust port, and thus, the reactive gas in the reaction chamber 20 can circulate in a direction from the bottom up in a smoother manner. Consequently, not only can the surfaces of the wafers be in uniform contact with the reactive gas, but also the concentration of the reactive gas in the reaction chamber 20 can be more uniformly distributed by the flow of the reactive gas, and accordingly, the temperature in the reaction chamber 20 can be more uniform as well.

In some embodiments, the gas intake structure includes a gas intake tube 17, which is disposed close to the bottom of the furnace tube body 11; the exhaust structure includes an exhaust passage and an exhaust port, with the exhaust passage arranged vertically, the top end of the exhaust passage communicated with the reaction chamber 20 and the bottom end of the exhaust passage communicated with the exhaust port; the exhaust port is higher than the gas intake tube, and the exhaust passage is higher than the cassettes 14. The reactive gas enters the reaction chamber 20 via the gas intake tube 17, and is sequentially blown to the gap between each two wafers spaced in the vertical direction from the bottom up. Since the exhaust passage is higher than the cassettes 14, the reactive gas then enters the exhaust passage from the top end of the exhaust passage and gets out via the exhaust port, and thus, the reactive gas in the reaction chamber 20 can circulate in a direction from the bottom up in a smoother manner. Consequently, not only can the surfaces of the wafers be in uniform contact with the reactive gas, but also the concentration of the reactive gas in the reaction chamber 20 can be more uniformly distributed by the flow of the reactive gas, and accordingly, the temperature in the reaction chamber 20 can be more uniform as well.

It should be understood that the aforementioned specific embodiments of the present application are merely intended to illustrate or explain the principle of the present application rather than constitute a limitation to the present application. Therefore, any modification, equivalent substitution, improvement and the like made without departing from the spirit and scope of the present application shall be included in the protection scope of the present application. In addition, the appended claims of the present application are intended to cover all changes and modifications that fall within the scope and boundaries of the appended claims or equivalents of such scope and boundaries.

What is claimed is:

1. A diffusion furnace, comprising:
   a furnace tube structure comprising a furnace tube body and a furnace bottom, a bottom of the furnace tube body being connected to the furnace bottom to form a reaction chamber; and
   a carrying structure comprising a pedestal and a plurality of cassettes disposed on the pedestal, the pedestal being disposed on the furnace bottom,
   wherein the furnace tube structure further comprises a gas path system configured to supply reactive gas to the reaction chamber, and the gas path system comprises a gas intake structure and an exhaust structure, both of which are disposed on the furnace tube body and communicated with the reaction chamber,
   wherein the gas intake structure comprises a gas intake tube, and the exhaust structure comprises an exhaust port; the gas path system further comprises vertical tubes communicated with the gas intake tube; the gas intake tube is disposed close to the bottom of the furnace tube body, and the exhaust port is disposed at the top of the furnace tube body; and the vertical tube is provided with a plurality of blowholes distributed at intervals along a vertical direction of the vertical tube, so that the reactive gas in the vertical tube can be blown to gaps between wafers spaced in a vertical direction.

2. The diffusion furnace of claim 1, wherein the pedestal is rotatably connected to the furnace bottom.

3. The diffusion furnace of claim 1, wherein the cassettes are rotatably connected to the pedestal.

4. The diffusion furnace of claim 1, wherein the furnace tube body and the furnace bottom are arranged to move up and down relative to each other.

5. The diffusion furnace of claim 2, wherein the plurality of the cassettes are distributed in a circumferential array at intervals along a central axis of rotation of the pedestal and the furnace bottom.

6. The diffusion furnace of claim 5, wherein the plurality of the cassettes are distributed in a circumferential array at intervals along a central axis of rotation of the pedestal and the furnace bottom.

7. The diffusion furnace of claim 2, wherein each of the cassettes is arranged to be separately rotated relative to the pedestal; and/or the plurality of cassettes are arranged to be rotated together relative to the furnace bottom through the pedestal.

8. The diffusion furnace of claim 5, wherein each of the cassettes is arranged to be separately rotated relative to the pedestal; and/or the plurality of cassettes are arranged to be rotated together relative to the furnace bottom through the pedestal.

9. The diffusion furnace of claim 1, wherein a first heater is disposed at a center surrounded by the plurality of cassettes, and is connected to the pedestal.

10. The diffusion furnace of claim 1, wherein the furnace tube structure further comprises second heaters, which are distributed outside the furnace tube body.

11. The diffusion furnace of claim 1, wherein the vertical tubes are distributed in a circumferential array at intervals along the central axis of rotation of the pedestal and the furnace bottom.

12. The diffusion furnace of claim 11, wherein the gas intake tube comprises a main gas inlet and an annular tube communicated with the main gas inlet, with the annular tube circularly disposed along the plurality of cassettes, and the vertical tubes are communicated with the annular tube.

13. The diffusion furnace of claim 1, wherein the vertical tubes are in one-to-one correspondence with the cassettes, which are located between the vertical tubes and the first heater.

14. The diffusion furnace of claim 1, wherein the gas intake structure comprises a gas intake tube, which is disposed close to the bottom of the furnace tube body;
   the gas path system further comprises vertical tubes communicated with the gas intake tube, and the vertical tube is provided with a plurality of blowholes distributed at intervals along a vertical direction of the vertical tube, so that the reactive gas in the vertical tube can be blown to the gaps between the wafers spaced in the vertical direction;
   the exhaust structure comprises an exhaust passage and an exhaust port, with the exhaust passage arranged vertically, a top end of the exhaust passage communicated with the reaction chamber and a bottom end of the exhaust passage communicated with the exhaust port;
   the exhaust port is higher than the gas intake tube, and the exhaust passage is higher than the cassettes.

15. The diffusion furnace of claim 1, wherein the gas intake structure comprises a gas intake tube, which is disposed close to the bottom of the furnace tube body;
   the exhaust structure comprises an exhaust passage and an exhaust port, with the exhaust passage arranged vertically, a top end of the exhaust passage communicated with the reaction chamber and a bottom end of the exhaust passage communicated with the exhaust port;
   the exhaust port is higher than the gas intake tube, and the exhaust passage is higher than the cassettes.

* * * * *